US010073502B2

(12) United States Patent
Petruzzo et al.

(10) Patent No.: US 10,073,502 B2
(45) Date of Patent: *Sep. 11, 2018

(54) EXTERNAL DRIVE CHASSIS STORAGE ARRAY

(71) Applicant: GreenTec-USA, Inc., Sterling, VA (US)

(72) Inventors: Stephen E. Petruzzo, Great Falls, VA (US); David Hatchett, Shenandoah Junction, WV (US)

(73) Assignee: GreenTec-USA, Inc., Sterling, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/651,020

(22) Filed: Jul. 17, 2017

(65) Prior Publication Data

US 2017/0315597 A1   Nov. 2, 2017

Related U.S. Application Data

(63) Continuation of application No. 14/968,459, filed on Dec. 14, 2015, now Pat. No. 9,710,028, which is a
(Continued)

(51) Int. Cl.
*G06F 1/20* (2006.01)
*G11B 33/12* (2006.01)
(Continued)

(52) U.S. Cl.
CPC ............. *G06F 1/20* (2013.01); *G06F 1/181* (2013.01); *G11B 33/128* (2013.01); *H05K 7/20736* (2013.01)

(58) Field of Classification Search
CPC ........ H05K 7/20145; H05K 7/14; G06F 1/20; G06F 1/181; G06F 1/187
(Continued)

(56) References Cited

U.S. PATENT DOCUMENTS 4,758,923 A   7/1988   Tanaka
5,027,254 A   6/1991   Cortits
(Continued)

FOREIGN PATENT DOCUMENTS

JP   2006164040 A   6/2006
JP   2009032068 A   2/2009

OTHER PUBLICATIONS

Sun Microsystems, "Sun Blade 8000 and 8000 P Modular Systems, Modular Architecture for Business and Mission Critical Applications and High Performance Computing," Feb. 2008.
(Continued)

*Primary Examiner* — Mandeep S Buttar
(74) *Attorney, Agent, or Firm* — Cahn & Samuels, LLP

(57) ABSTRACT

The invention in at least one embodiment includes a system that includes a chassis having a frame present within a housing where the frame includes at least two plates having a base and two grills running widthwise along and on opposite ends of the base, a plurality of walls between the at least two plates, and at least one baffle running between the plates at an angle to the plates; at least one power supply; and a plurality of fans electrically connected to the at least one power supply; wherein there are at least two air flow paths through the chassis that pass through at least one fan and pass at least one baffle through a duct defined by the housing and the frame. In at least one embodiment, the chassis receives at least one storage drive.

20 Claims, 7 Drawing Sheets

Related U.S. Application Data continuation of application No. 13/833,246, filed on Mar. 15, 2013, now Pat. No. 9,214,194.

(60) Provisional application No. 61/771,078, filed on Mar. 1, 2013.

(51) Int. Cl.
 *G06F 1/18* (2006.01)
 *H05K 7/20* (2006.01)

(58) Field of Classification Search
 USPC .......................................... 361/679.47–699
 See application file for complete search history.

(56) References Cited

U.S. PATENT DOCUMENTS

| | | | |
|---|---|---|---|
| 5,063,477 | A | 11/1991 | Paggen |
| 5,313,369 | A * | 5/1994 | Lewis .................. H05K 7/1425 361/752 |
| 5,909,357 | A | 6/1999 | Orr |
| 6,064,568 | A * | 5/2000 | Schmitt .................. G06F 1/181 361/679.31 |
| D483,033 | S | 12/2003 | McClelland, II |
| 6,717,807 | B2 | 4/2004 | Hikawa |
| 6,927,980 | B2 | 8/2005 | Fukuda |
| 8,047,383 | B2 | 11/2011 | Hendrix |
| 8,240,485 | B2 | 8/2012 | Bushby |
| 8,737,067 | B1 | 5/2014 | Kim |
| D738,874 | S * | 9/2015 | Petruzzo ...................... D14/312 |
| 9,214,194 | B2 | 12/2015 | Petruzzo et al. |
| 9,710,028 | B2 | 7/2017 | Petruzzo et al. |
| 2003/0030975 | A1 | 2/2003 | Bestwick |
| 2003/0223193 | A1 | 12/2003 | Smith |
| 2005/0280986 | A1 | 12/2005 | Coglitore |
| 2007/0053154 | A1 | 3/2007 | Fukuda |
| 2007/0258211 | A1 | 11/2007 | Sonobe |
| 2008/0174948 | A1* | 7/2008 | Davis ................... G11B 33/127 361/679.31 |
| 2008/0285221 | A1 | 11/2008 | Imsand |
| 2009/0152216 | A1 | 6/2009 | Champion |
| 2013/0267162 | A1 | 10/2013 | Hung |

OTHER PUBLICATIONS

Wikipedia, "Blade Server," May 18, 2009.
ZDNet.co.uk, "Blade Business," Jun. 4, 2007, http://reviews.zdnet.co.uk/hardward/servers/0.1000001735,39287354,00.htm.
Bean, John, et al., "Energy Efficient Cooling for Data Centers: A Close-Coupled Row Solution," ASHRAE Journal, Oct. 2008, White Paper #137.
Dunlap, Kevin, et al., The Advantages of Row and Rack-Oriented Cooling Architectures for Data Centers, American Power Conversion, 2006, White Paper #130.
Espacenet, English Abstract of JP 2006164040, printed on Oct. 12, 2011.
Espacenet, English Abstract of JP 2009032068, printed on Oct. 12, 2011.

\* cited by examiner

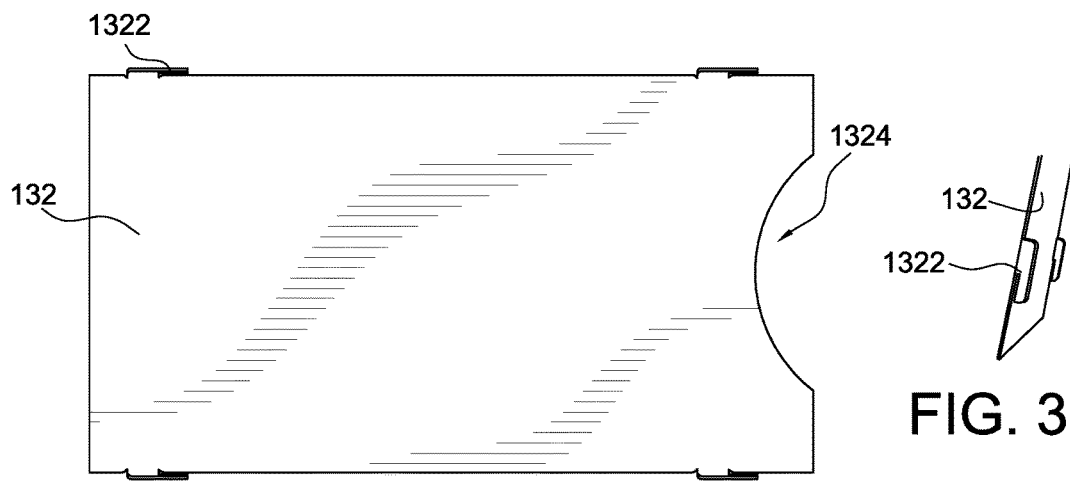
FIG. 3A
FIG. 3B
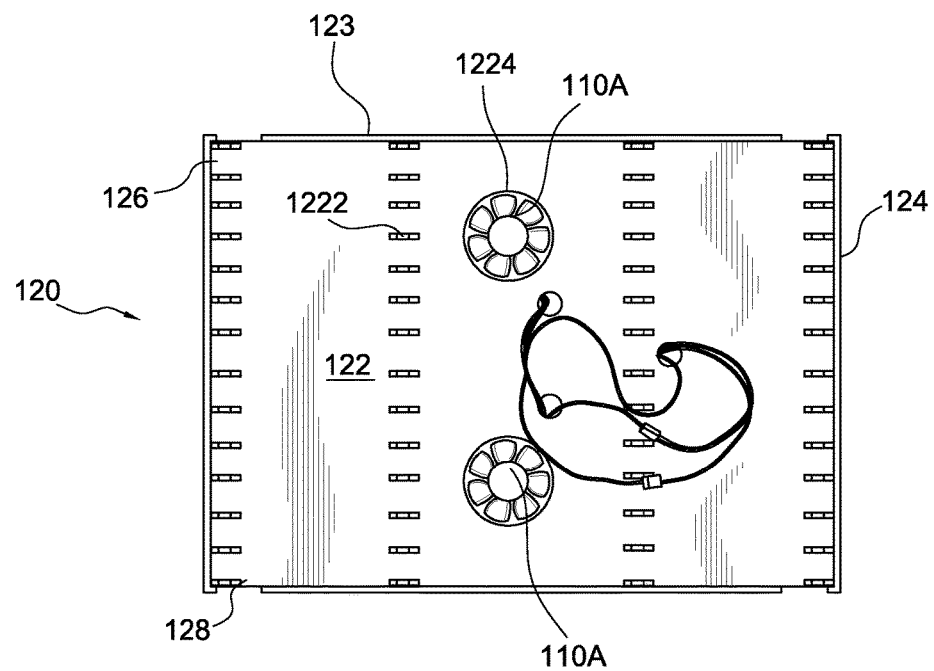
FIG. 4

EXTERNAL DRIVE CHASSIS STORAGE ARRAY

This patent application is a continuation patent application of U.S. patent application Ser. No. 14/968,459, filed Dec. 14, 2015 and now U.S. Pat. No. 9,710,028, which is a continuation patent application of U.S. patent application Ser. No. 13/833,246, filed Mar. 15, 2013 and now U.S. Pat. No. 9,214,194, which claims priority to of U.S. Provisional Patent Application No. 61/771,078, filed Mar. 1, 2013 which are hereby all incorporated by reference in their entirety.

I. SUMMARY OF THE INVENTION

In at least one embodiment, the invention includes a system having a chassis including: a housing; a frame present within the housing, the frame having at least two plates having a base and two grills running widthwise along the base, a plurality of walls between the at least two plates, and at least one baffle running between the plates at an angle to the plates; at least one power supply; and a plurality of fans electrically connected to the at least one power supply; wherein at least one first path extends through one of the grills into a cavity defined by the housing and one of the plates through an opening in the plate base into at least one respective fan through spaces defined by the walls at an end of the chassis opposite the grill, at least one second path extends through spaces defined by the other walls through the other fans opposing the fans in the first path into an opening into a cavity defined by the other plate and the housing out through the grill of the plate at the end of the base opposite to a start of the second path, and the at least one baffle separates the first path from the second path. In at least one embodiment, the two paths provide two distinct areas to contain storage drives with pathways that provide front to back airflow through the two isolated areas. The arrangement of components in at least one embodiment allows for direct airflow in such a way that cool air is input to both distinct areas without allowing hot air from the front area to enter the second area and vice versa.

In a further embodiment to the above embodiments, the system further includes two longitudinal duct walls running lengthwise between the plates defining an area in which the at least one power supply resides. In a further embodiment to the prior embodiment, the spaces between neighboring walls are substantially equal other than the space between the longitudinal duct walls. In a further embodiment to either of the prior two embodiments, at least one first path includes two paths each running through different fans, and the at least one second path includes two paths each running through different fans from the first path fans. A further embodiment to the other embodiments in this paragraph, the system further including a grill panel between the two longitudinal duct walls. A further embodiment to the other embodiments in this paragraph, each grill includes a solid blank aligned with the two longitudinal duct walls. A further embodiment to the other embodiments in this paragraph, there are a plurality of spaces for storage drives are defined on either side of the two longitudinal duct walls in the front and the rear of the chassis.

In a further embodiment to the above embodiments, the system further includes a plurality of storage drives electrically connected to the at least one power supply. A further embodiment to the prior embodiment, each storage drive includes a housing enclosing a drive and having a plurality of openings passing through at least two sides of the housing. A further embodiment to the other embodiments in this paragraph, each storage drive includes at least one communication connector and a power connector. A further embodiment to the other embodiments in this paragraph, each storage drive includes a handle.

In a further embodiment to the above embodiments, the system further includes mounting brackets attached to the housing.

In a further embodiment to the above embodiments, the system further includes a power switch electrically connected to the at least one power supply.

In a further embodiment to the above embodiments, the system further includes an alert system electrically connected to the at least one power supply having a circuit detecting when a power supply has quit working and a silence button.

In a further embodiment to the above embodiments, the system further includes wiring running from the at least one power supply to a plurality of plugs with each plug being associated with a respective space defined by the neighboring walls and the wiring for the respective space passing through a grill.

In a further embodiment to the above embodiments, the system further includes a plurality of wiring harness supports running along at least one grill in the front of the chassis and at least one grill in the rear of the chassis.

In a further embodiment to the above embodiments, the system further includes at least one cavity baffle present in at least one of the cavities defined by the housing and the frame. In a further embodiment to the prior embodiment, the cavity baffle is located on a side of the fans opposite from the end of the plate grill through which the flow path passes.

In a further embodiment to the above embodiments, the housing includes an upper housing having three walls; and a lower cover that defines a space. In a further embodiment to the embodiments in the prior paragraphs, the housing includes a top, a bottom, and two side walls connected together to define a space with open ends.

In a further embodiment to the above embodiments, the frame further includes two opposing walls running lengthwise along the base.

In at least one embodiment according to the invention, the system includes a chassis that enables insertion of external storage drive into it with no human contact with the physical disk contained in the storage drive. In at least one embodiment, humans only touch the physical disk when it is initially installed into the storage drive. From then onward, only the outside of the external storage drive is touched and not the physical disk itself. The storage drives operate within the chassis while also being able to act as a removable drive from the chassis and then act as a standalone drive that can be attached individually to any computer without use of the chassis. This cannot be done with current methods where a physical disk placed in a tray and slid into existing chassis, where in order for the drive to operate, it needs to be inserted into the chassis and cannot operate standalone.

II. BRIEF DESCRIPTION OF THE DRAWINGS

The present invention is described with reference to the accompanying drawings. In the drawings, like reference numbers indicate identical or functionally similar elements. The use of cross-hatching and shading within the drawings is not intended as limiting the type of materials that may be used to manufacture the invention. The use of arrow lines in the figures is to show air flow through the system.

FIG. 1 illustrates a partially transparent front perspective view of at least one embodiment according to the invention.

FIG. 2A illustrates a front perspective view of a frame according to at least one embodiment of the invention. FIG. 2B illustrates an enlarged side view of a section of the frame where the rear is on the left and the front is on the right of the figure. FIG. 2C illustrates a schematic side view of the embodiment illustrated in FIG. 2B. FIG. 2D illustrates an alternative embodiment to the embodiment illustrated in FIG. 2C. In FIGS. 2C and 2D, the front of the chassis is on the left and the rear is on the right.

FIGS. 3A and 3B illustrate an example wall for use in at least one embodiment according to the invention.

FIG. 4 illustrates a top view of a frame according to at least one embodiment of the invention.

The figures are meant to provide examples of the flexibility provided by the invention and not limitations on the scope of the invention.

III. DETAILED DESCRIPTION OF THE INVENTION

The invention in at least one embodiment provides a chassis into which multiple storage drives are capable of being inserted and air flow paths that travel in part through ducts and are controlled by air movement means such as fans. In at least one embodiment, the storage drives are hot-swappable. In at least one embodiment, the system includes at least one power supply for providing power to the inserted storage drives and air movement means. In at least one embodiment to either of the above embodiments, the system includes attachment points for routing connection cables to at least one external drive controller although in an alternative embodiment the drive controller is present in the chassis, for example, occupying one or more drive slots or extending the housing above the frame to accommodate the drive controller(s). In at least one embodiment, the storage drives are external hard drives sized to fit into the chassis slots. In a further embodiment, the external hard drives are a protective case (or housing) around an internal hard drive. In a further embodiment under either of the prior two embodiments, the storage drive is removable and usable to connect to an individual computer directly. The removability of the storage drives allows for them to be swapped when one storage drive becomes substantially full or on demand. In at least one embodiment, when a plurality of storage drives are inserted into the chassis, the chassis houses, powers, cools and manages the inserted storage drives while allowing for individual storage drives to be removed.

Figure 1:
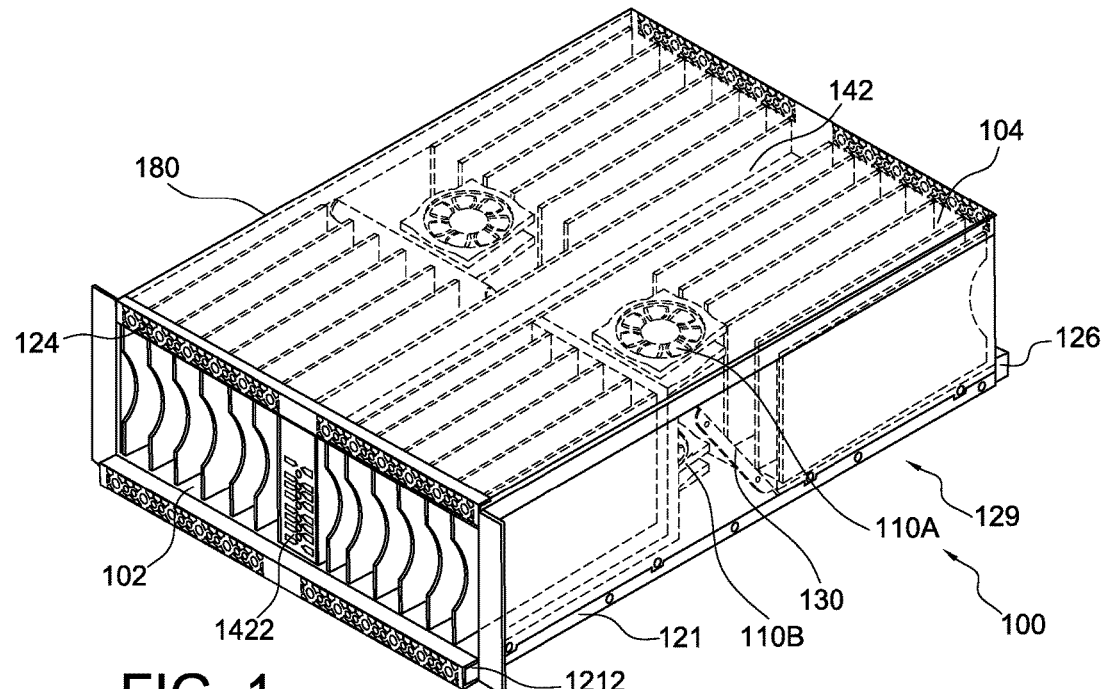

FIG. 1 illustrates a partially transparent view of an example embodiment of a chassis 100 that includes twelve (12) slots 102 in the front and twelve (12) slots 104 in the rear for the insertion of storage drives 190. Although twenty-four (24) slots are illustrated, it should be understood form this disclosure that the number of slots can vary from that illustrated such as from one slot in the front and one slot in the rear to multiple slots depending on the desired density, space available, and storage drive size. The illustrated configuration depicts the use of 3.5 inch regular hard drives, but if 3.5 inch low-profile drives are used, then thirty-two (32) slots would be provided. A further example is if 2.5 inch drives are used, then the slot density may increase to ninety-six (96) slots and the overall size of the slots would shrink along with potentially the chassis height or alternatively the drives could be stacked. A similar increase in density would result from the use of solid state storage drives.

Figure 2A:
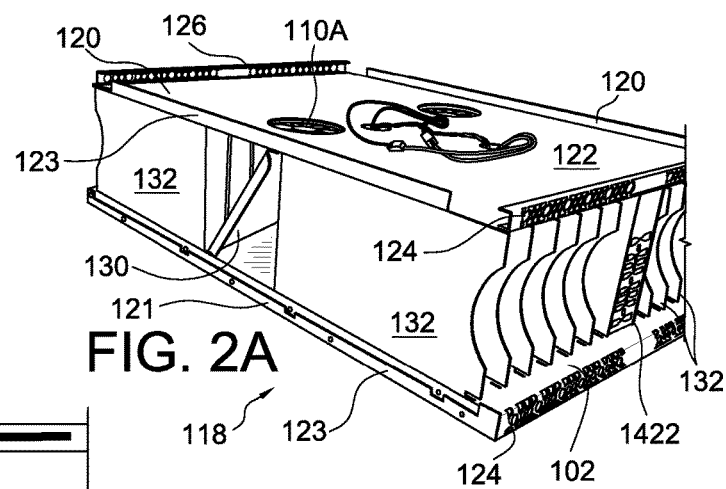
Figure 2B:
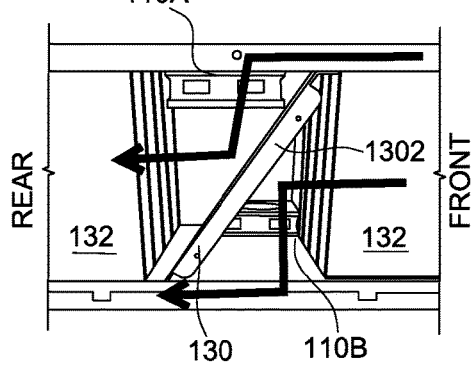
Figure 2C:
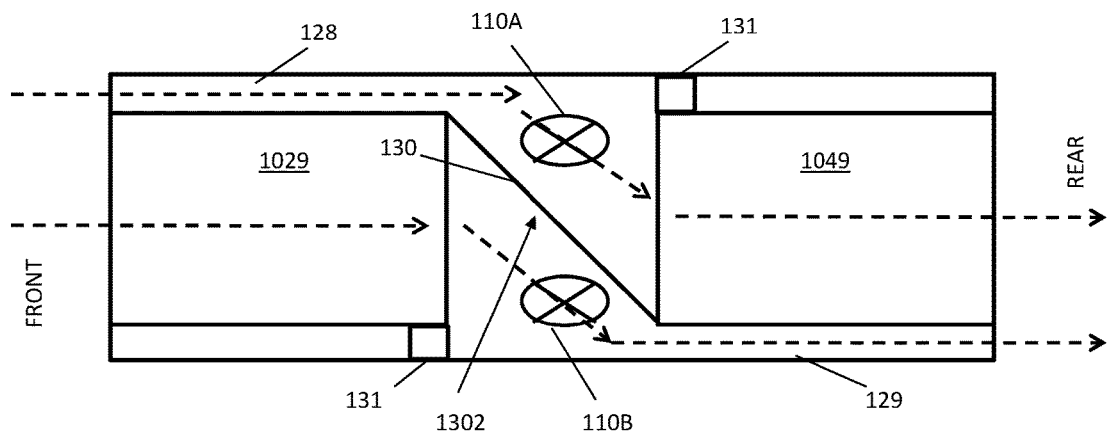
Figure 2D:
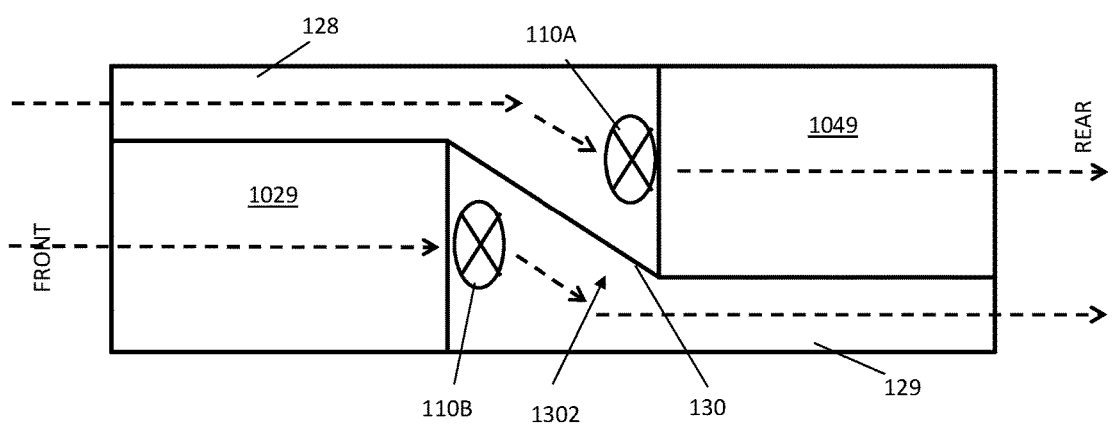

The illustrated chassis 100 in FIGS. 1-2D includes a duct on top 128 and on the bottom 129 for routing air flow through the chassis 100 using the illustrated fans 110A, 110B. In at least one embodiment, the first path for air flow is through the front top grill 124 into the top duct 128 (illustrated in FIG. 2C) to be drawn in by the pair of fans 110A to flow past the baffle 130 into the rear slots 104 and any inserted storage drives out to the rear of the chassis 100 as illustrated, for example, in FIG. 2B. The second path for air flow is through the front slots/storage drives past the bottom side 1302 of the baffle 130 through the fan 110B into the lower duct 129 (illustrated in FIG. 2C) of the chassis 100 to then pass out through bottom rear grill 126. In a further embodiment illustrated in FIG. 2C, there is at least one additional (optional) cavity baffle 131 present in the upper duct 128 and/or the lower duct 129 to provide a buffer (or block) to the air going in the wrong direction through the chassis. In another alternative embodiment, the air flow paths are switched between top and bottom. In a further alternative embodiment, there is a cooling mechanism such as a chiller, a coil or other conduit present in the duct for the air to pass over to cool it. In a further alternative embodiment illustrated in FIG. 2D, the front set 1029 of storage drives is offset relative to the rear set 1049 of storage drives, which would eliminate the need for baffles 131, to define top duct 128' and bottom duct 129'. In at least one embodiment, the shelf 1224 that supports the rear set 1049 of storage drives would be supported by the attached housing or alternatively by support members extending between the plate and the lower housing surface (or another plate of the chassis). One advantage of the offset orientation is to increase the air flow through the system while maintaining the height of the chassis by having the duct present only above or below the storage drives. FIGS. 2C and 2D illustrate how fans 110A, 1106 may have a variety of orientations while still providing movement of air along the respective flow paths (illustrates as dashed arrow lines).

In a further embodiment, each drive slot includes a switch (or sensor) to detect the presence of a storage drive. Examples of locations for the switch include along the sides of the drive slot or on any structure that is present on the internal end of the drive slot. The switch is in communication with a fan controller to control operation of the fan providing air for that drive slot such that if all the slots are empty, the fan controller will turn the fan off until a storage drive is inserted into one of the associated drive slots.

In another alternative embodiment, a single large fan or HVAC vent could be attached to the front of the chassis and an exhaust vent to the rear of the chassis where the inlet for the rear drives would come from the front of the top tray and the inlet for the front drives would be fed into the front of the front drives. The exhaust for the front drives would be at the rear of the bottom tray and the exhaust for the rear drives would be through the front of the rear drives. This air flow could also reverse top and bottom trays (e.g., inlet for rear drives could come from front of the bottom tray and exhaust for the front drives could be the rear of the top tray). However, air flow is conventionally inlet (cold) from a chassis front and exhaust (hot) from the chassis rear, so you would not typically reverse this.

The external cover 180, the internal frame 118, and the grills 124, 126 define the upper and lower ducts 128, 129 that exist in the defined cavities. FIG. 2A illustrates an example of the internal frame that includes an upper plate 120, a lower plate 121 and a plurality of walls 132 (see also FIGS. 3A and 3B). In at least one embodiment, the upper plate 120 and the lower plate 121 are substantially identical although in the drawings they are illustrated as being similar to each other where the lower plate is a longer version of the upper plate. In at least one embodiment the plates each include a base 122 with a pair of vertical walls 123 running on opposite sides of the base 122 and two grills 124, 126 that run widthwise on either end of the base 122 as illustrated, for example, in FIG. 4. The base 122 includes a plurality of holes 1222 that connect with the walls 132 (illustrated, for example, in FIGS. 3A and 3B) and a pair of openings 1224 on which the fans 110A, 110B are mounted on to control the flow of air through the chassis 100 as illustrated, for example, in FIGS. 2B-2D, which includes arrows depicting the direction of the air flow. FIGS. 3A and 3B illustrate an example of a wall that includes four tabs 1322 that extend from it for engaging the plate holes 1222 where the free end of the tab overlaps with the base 122 as illustrated, for example, in FIG. 4. The wall 132 in at least one optional embodiment includes a curved slot 1324 extending in from one end, which allows for an inserted storage drive 190 to be grabbed on either side for removal in addition to any handle present on the storage drive 190.

The illustrated external cover 180 includes two pieces: an upper housing 182 and a lower cover 184. The upper housing 182 as illustrated, for example, in FIGS. 5A and 5B includes three walls 1822, 1824, 1826 that cover three sides of the frame 118, which in the illustrated embodiments are the two sides and top of the frame 118. The lower cover 184 encloses the lower duct 129 and the frame 118 as illustrated, for example, in FIG. 6. In an alternative embodiment, the housing includes a cover with a top, a bottom and two sides that slides over the frame. In an alternative embodiment, the housing includes a top cover and a bottom cover to enclose the ducts and two small side walls that cover the illustrated openings between the end of the walls 132 (see, e.g., FIGS. 2A and 2B for an example of the cavities).

The illustrated embodiments also include two optional mounting brackets 186 on either side of the chassis front that are held in place between the upper housing 182 and the frame 118. In a further embodiment the alternative brackets are present instead on either side of the chassis rear or alternatively the brackets are present in the front and the rear of the chassis. One potential use of these brackets is for mounting the chassis in a server rack. Based on this disclosure, it should be appreciated that a variety of bolt holes may be used other than that illustrated in the drawings.

Figure 5A:
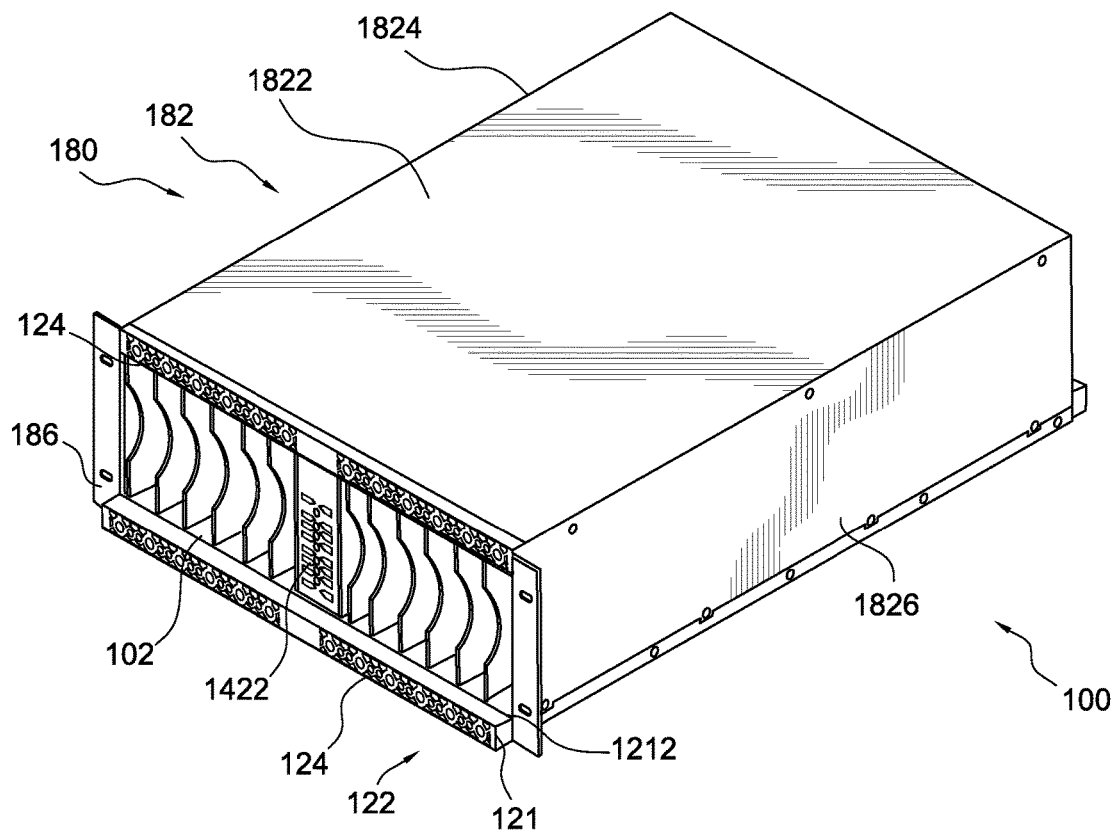
FIGS. 5A and 5B illustrate front perspective views of alternative embodiments of the chassis according to the invention with FIG. 5B illustrating the chassis with inserted storage drives.
Figure 5B:
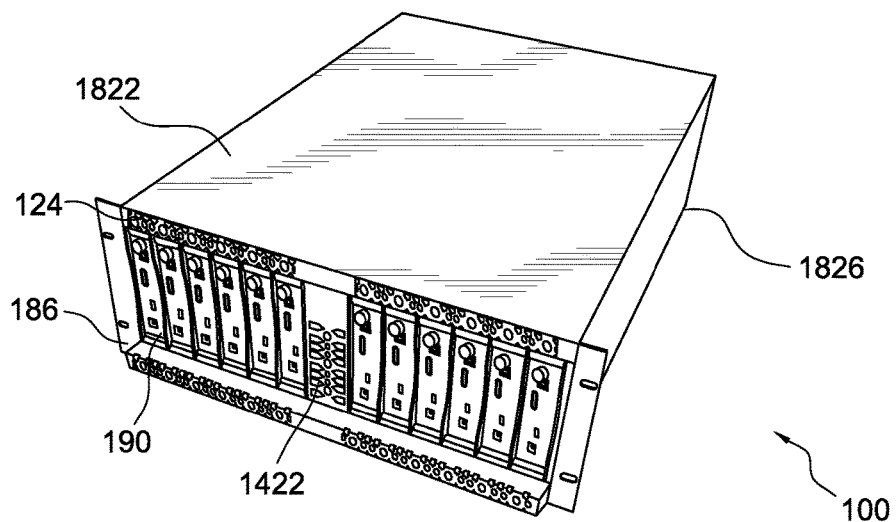
Figure 6:
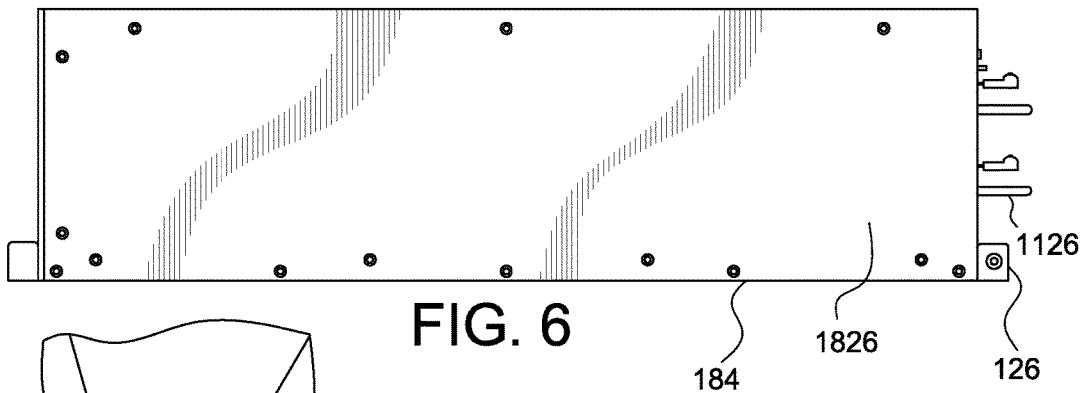
FIG. 6 illustrates a side view of the embodiment illustrated in FIGS. 1 and 5A.
Figure 7:
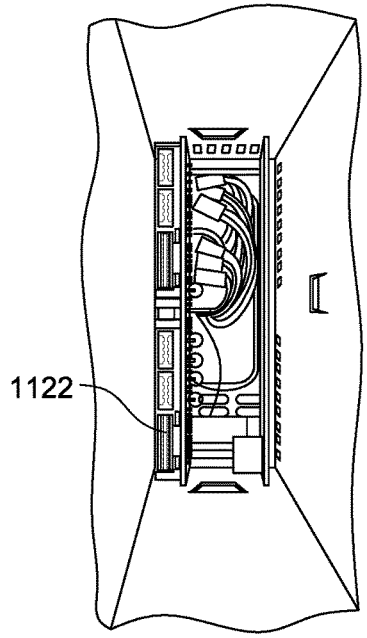
FIG. 7 illustrates an internal view of at least one embodiment according to the invention.

In at least one embodiment with at least one power supply 112, there is a central duct 142 that runs down the internal frame lengthwise that provides a separate air path for cooling the at least one power supply 112. In a further embodiment, the central duct 142 may include at least one fan for pulling air in and through the central duct 142. FIGS. 1, 5A and 5B also illustrate an example of an alternative embodiment that includes an optional central grill 1422 that allows air to pass through the optional central duct that runs down the middle of the frame 118 where each of the two paths (i.e., first and second) have separate duplicative mirror paths that are separated by the central duct 142. In an alternative embodiment, the central duct provides the storage area for at least one power supply 112 that is inserted from the rear and attaches to a respective jack/connector 1122 that then powers the storage drives and the fans 110A, 110B as illustrated, for example, in FIG. 7. FIG. 7 also illustrates an example of two jacks for a chassis that is designed for redundant power supplies.

Figure 8B:
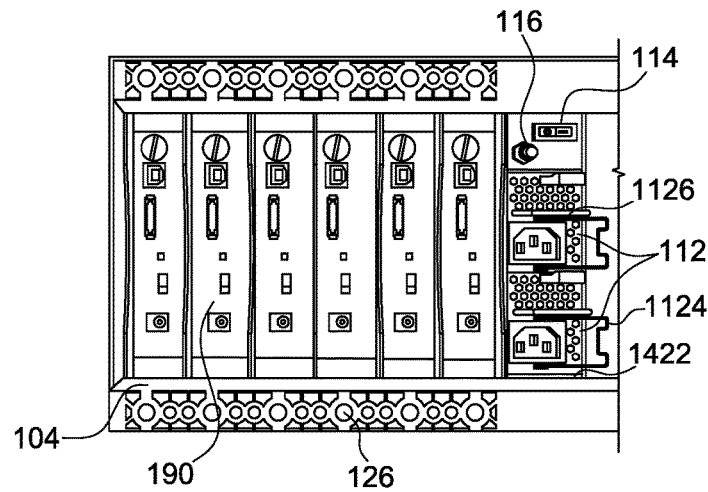
FIGS. 8A and 8B illustrate a rear view of the embodiment illustrated in FIG. 5B with storage drives inserted into the chassis with FIG. 8B an enlarged view of a portion of FIG. 8A.
Figure 8A:
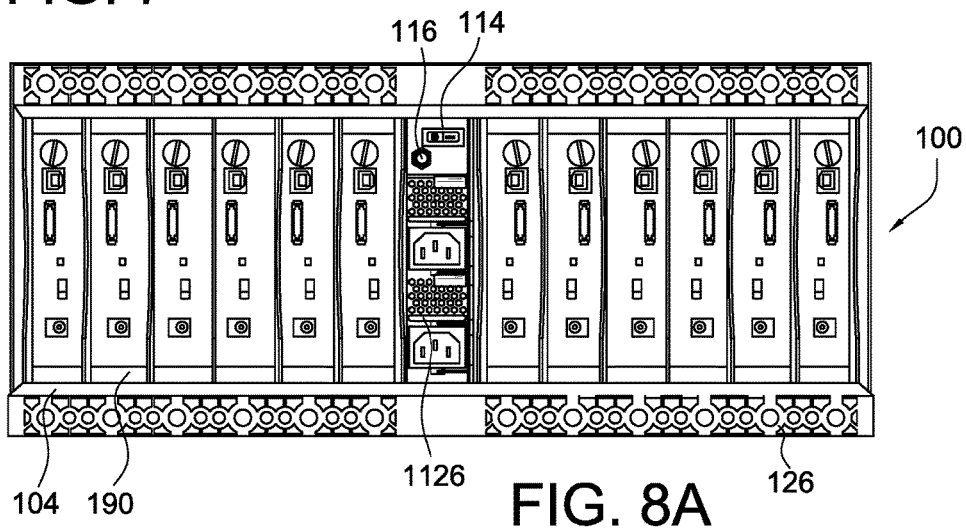

FIGS. 8A and 8B illustrate the presence of two redundant power supplies 112 and an on-off switch 114 for the system. Although redundant power supplies 112 are present, it should be appreciated based on this disclosure that just one power supply 112 may be used or a plurality of power supplies 112 may be used in the system. The illustrated embodiment shows the presence of a reset button 116 that can be used to silence or otherwise turn off an alert for a period of time such as a predetermined length of time or until a replacement power supply 112 has been inserted in an alternative embodiment. The alert in at least one embodiment is for a power supply that has quit working with examples of the alert being an audio (e.g., beep, buzz or other sound) or visual alert. The illustrated power supplies 112 also include a wire bracket 1124 to flip over the inserted power cable to assist with securing the power cable (not illustrated) to the power supply 112. Also illustrated is the presence of handles 1126 on the inserted power supply.

Figure 9:
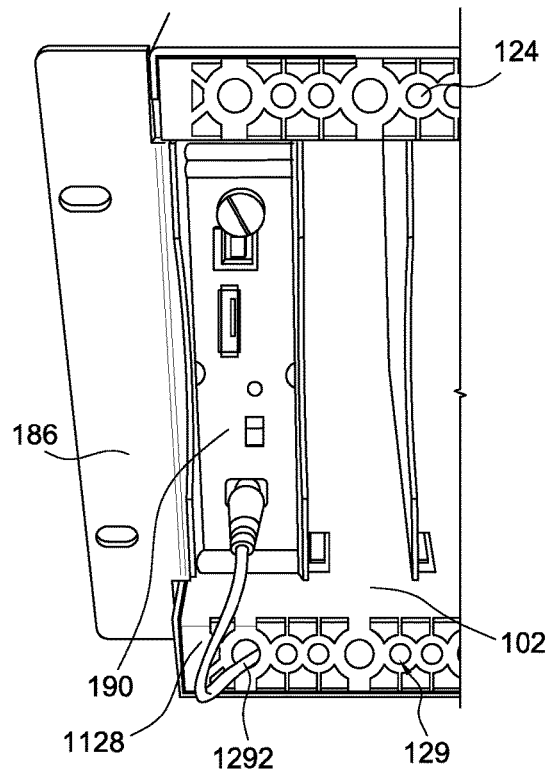
FIG. 9 illustrates an example of how a power cable may be attached to a storage drive according to at least one embodiment of the invention.
Figure 10B:
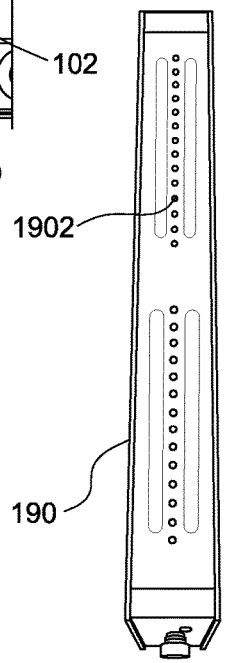
Figure 10C:
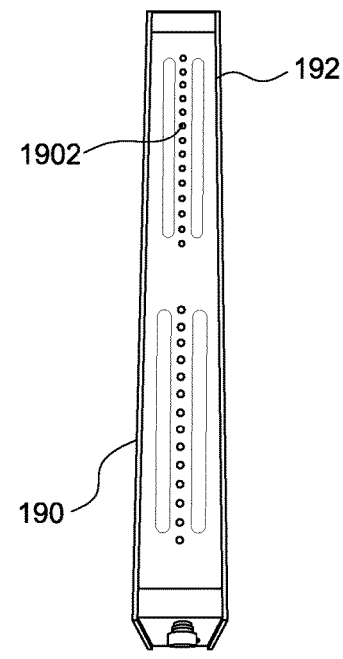

In at least one embodiment, the power cables for the individual storage drives run through the lower duct 129 such that the power cable 1128 passes out through the respective round opening 1292 for the storage drive 190 as illustrated in FIG. 9 that shows a power cable 1128 connected to an inserted storage drive 190. It should be appreciated that an alternative arrangement would be to flip the storage drive over to have the power cable come through the top grill 124 for connection to the storage drive.

Figure 10A:
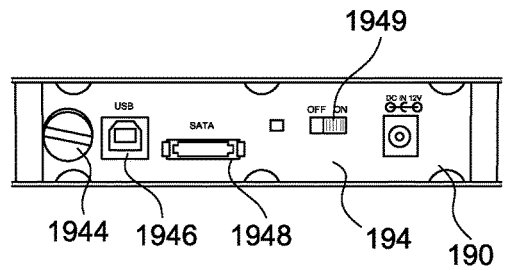
FIGS. 10A-10D illustrate examples of a storage drive according to the invention.
Figure 10D:
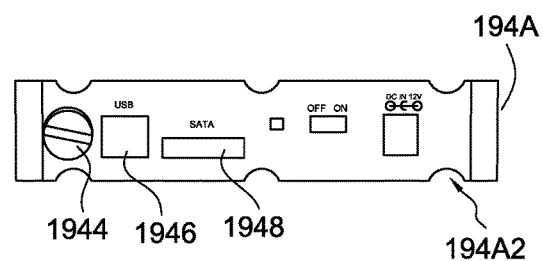

FIGS. 10A-10D illustrate the front and side views of a storage drive 190 that would have a plurality of holes 1902 passing through its rear (such as that illustrated in FIG. 12), sides, and front to facilitate airflow through and around the internal components of the storage drive. In at least one embodiment, the storage drive 190 includes a housing 192 for protecting an internal hard drive. FIG. 10D illustrates an alternative front face 194A for use with the storage drive that includes a plurality of scallop shape openings 194A2 to assist with air flow through the storage drive 190 although other shaped openings could be used instead. Both illustrated front faces 194, 194A of the storage drive 190 provide an example of a handle for removing the storage drive 190 after insertion by use of a thumb screw 1944 (which in an alternative embodiment is removed and reinsert when the storage drive is to be removed) although other handles are possible such as a post, a screw, a bolt, a tab, a J- or U-shaped member extending from the front, a finger hole (which could also provide additional air flow through the storage drive). Although a USB and an external SATA connector 1946, 1948 are illustrated other connectors could be used or take their place or alternatively just one computer connector is present. In an alternative embodiment, there is a backplane with at least one connector present at the internal end of the slot that provides a connection point for power and/or a communications connector(s) of the respective storage drive instead of the illustrated front connection. Also illustrated is an optional off-on switch 1949 that allows for controlling whether the storage drive 190 is on or off.

In an alternative optional embodiment, the system includes one or more LEDs, LCDs, or other type of display proximate each slot or on the storage drive to provide an indication of whether the internal physical disk has power, is operational, needs to be removed, and/or status information. This type of display will assist the operator in determining the status of the drive and indicate which drive is to be removed and/or serviced.

Figure 11:
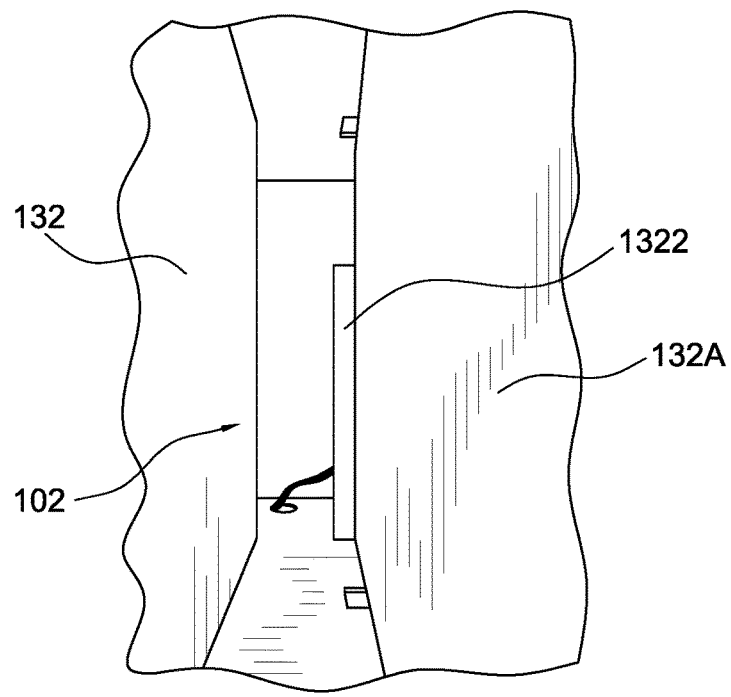
FIG. 11 illustrates an internal view of at least one embodiment according to the invention.

FIG. 11 illustrates an alternative embodiment of a wall 132A having a rear stop (or vertical wall) 1322 extending horizontally from the wall 132A to provide a stop to the depth of insertion of the storage drive 190. This configuration allows for the insertion depth to be controlled and to align the front of the storage drive 190 for insertion of cables and to prevent the storage drive 190 from being inserted further when one or more cables are attached to the front of the storage drive 190. In at least one embodiment, the vertical wall 1322 extends partially into the space 102 (or 104) between neighboring walls 132A to control the air flow through the storage drive 190. In a further embodiment, the vertical wall is space from the internal end of the drive slot (for example, the width of the slot) and substantially covers the entire cross-section of the drive slot and includes at least one hinge that allows the wall to pivot out of the slot and against one of the walls 132A when a storage drive is inserted, but otherwise substantially blocks air flow through an unoccupied drive slot.

Figure 12:
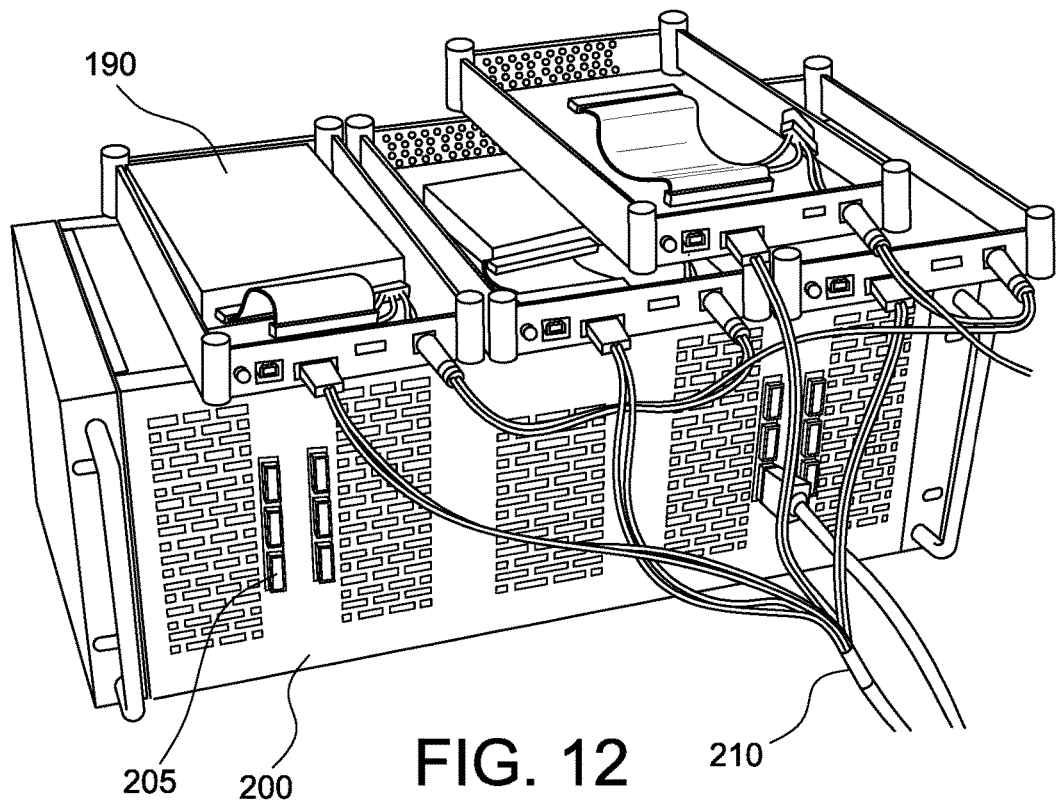
FIG. 12 illustrates an example drive controller attached to four storage drives with a wiring harness according to at least one embodiment of the invention.

In at least one embodiment, there are a plurality of wiring brackets present along the grill for holding the wiring harness 210 coming from an external drive controller 200 like that illustrated in FIG. 12, which shows multiple storage drives 190 sitting on top of the controller 200 and the wiring 210 with connectors 205 (twelve are illustrated although other numbers of connectors could be present) that would run to different storage drives 190 from the drive controller 200 where one wiring harness in the illustrated example would connect to four storage drives although other ratios of wiring harness to storage drives could be used. The brackets help secure the wiring harness to the chassis and provide support for the wire harness to support any cable that extends from the wiring harness to the respective storage drive.

FIGS. 1 and 5A illustrate an alternative embodiment for the chassis 100 where the lower plate 121 includes a ridge 1212 that helps to secure the storage drives 190 inside the chassis 100. This is accomplished in part by the ridge 1212 extending above the base 122 of the plate 120, 121 along the back side of the grill 124. Other examples of how to secure the storage drives into the chassis include, but are not limited to, a screw, a latch, a bar, a clip, and a dimple.

The use of dimensions in the above disclosure is done with the recognition of manufacturing tolerances for components.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the root terms "include" and/or "have", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means plus function elements (if any) in the claims below are intended to include any structure, or material, for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As used above "substantially," "generally," and other words of degree are relative modifiers intended to indicate permissible variation from the characteristic so modified. It is not intended to be limited to the absolute value or characteristic which it modifies but rather possessing more of the physical or functional characteristic than its opposite, and preferably, approaching or approximating such a physical or functional characteristic.

Although the present invention has been described in terms of particular example embodiments, it is not limited to those embodiments. Alternative embodiments, examples, and modifications which would still be encompassed by the invention may be made by those skilled in the art, particularly in light of the foregoing teachings.

Those skilled in the art will appreciate that various adaptations and modifications of the preferred and alternative embodiments described above can be configured without departing from the scope and spirit of the invention. Therefore, it is to be understood that, within the scope of the appended claims, the invention may be practiced other than as specifically described herein.

The invention claimed is:

1. A system comprising a chassis including: a housing; a frame present within said housing, said frame having at least two plates, each plate having a base and at least two end openings running widthwise along where at least one end opening is on each of opposite ends of said base, a plurality of walls between said at least two plates, and at least one baffle at an angle to said plates; and wherein at least one first path extends through at least one of said end openings into a cavity defined by said housing and one of said plates through at least one opening in said plate base through spaces defined by said walls at an end of the chassis opposite said at least one end opening, at least one second path extends through spaces defined by said other walls into at least one opening in said second plate base into a cavity defined by the other plate and said housing out through said at least one end opening of said plate at the end of the base opposite to a start of the second path, and said at least one baffle separates the first path from the second path.

2. The system according to claim 1, further comprising at least one power supply.

3. The system according to claim 2, further comprising two longitudinal duct walls running lengthwise between said plates, wherein said at least one first path includes at least two paths each running through different openings, and
said at least one second path includes at least two paths each running through different openings from the first path such that said at least one first path and said second path flow in the same direction.

4. The system according to claim 2, further comprising a plurality of storage drives electrically connected to said at least one power supply.

5. The system according to claim 4, wherein each storage drive includes a housing enclosing a drive and having a plurality of openings passing through at least two sides of said housing.

6. The system according to claim 5, wherein each storage drive includes at least one communication connector and a power connector.

7. The system according to claim 4, wherein each storage drive includes a combined connector for communications and power.

8. The system according to claim 4, wherein each storage drive includes a handle.

9. The system according to claim 2, further comprising wiring running from said at least one power supply to a plurality of plugs with each plug being associated with a respective space defined by said neighboring walls.

10. The system according to claim 2, further comprising a plurality of wiring harness supports running along the front of said chassis and the rear of said chassis.

11. The system according to claim 3, further comprising a grill panel between said two longitudinal duct walls.

12. The system according to claim 3, further comprising a solid blank aligned with said two longitudinal duct walls.

13. The system according to claim 1, wherein a plurality of spaces for storage drives are defined in the front and the rear of said chassis.

14. The system according to claim 1, further comprising at least one cavity baffle present in at least one of said cavities defined by said housing and said frame.

15. The system according to claim 1, wherein said housing includes an upper housing having three walls; and a lower cover that defines a space with said upper housing.

16. The system according to claim 1, wherein said housing includes a top, a bottom, and two side walls connected together to define a space with open ends.

17. The system according to claim 1, wherein said frame further includes two opposing walls running lengthwise along said base.

18. The system according to claim 1, wherein said frame further includes a first shelf and a second shelf connected by said at least one baffle,
said first shelf connects to a plurality of walls attached to the base of one of said at least two plates such that said first path is above said first shelf, and
said second shelf connects to a plurality of walls attached to the base of another of said at least two plates such that said second path is below said second shelf.

19. The system of claim 1, wherein each wall includes a rear stop extending from a respective wall and extending perpendicular to said plurality of walls.

20. The system according to claim 19, wherein:
each plate base having a plurality of slots,
each wall between said plates having a plurality of tabs extending from a top edge and/or a bottom edge of said wall,
each tab engages a respective slot in said plate bases, and
said walls fasten to said plate bases by the overlapping tabs and said slot base.

* * * * *